United States Patent [19]

Yoshida

[11] Patent Number: 5,206,180
[45] Date of Patent: Apr. 27, 1993

[54] PROCESS FOR PRODUCING AN AMORPHOUS PHOTOELECTRIC TRANSDUCER

[75] Inventor: Takashi Yoshida, Kanagawa, Japan

[73] Assignee: Fuji Electric Corporate Research and Development Ltd., Kanagawa, Japan

[21] Appl. No.: 742,333

[22] Filed: Aug. 8, 1991

[30] Foreign Application Priority Data

Aug. 10, 1990 [JP] Japan .................................. 2-211952

[51] Int. Cl.$^5$ .................. H01L 31/18; H01L 31/0376; H01L 21/205
[52] U.S. Cl. ........................ 437/4; 427/578; 437/100; 437/101; 136/258; 257/431
[58] Field of Search .......... 136/258 AM; 357/2, 30 F, 357/30 J, 30 K; 437/4, 100–101; 427/39, 74, 255.2, 578

[56] References Cited

U.S. PATENT DOCUMENTS 4,624,862 11/1986 Yang et al. ............................ 427/74
5,061,322 10/1991 Asano ......................... 136/258 AM

FOREIGN PATENT DOCUMENTS 60-154521 8/1985 Japan ........................... 136/258 AM

*Primary Examiner*—Aaron Weisstuch
*Attorney, Agent, or Firm*—Finnegan, Henderson, Farabow, Garrett & Dunner

[57] ABSTRACT

An amorphous photoelectric transducer of the type that converts light energy to electric energy using a p-n or p-i-n junction in an amorphous semiconductor having a p-type film on the light entrance side is disclosed. The p-type amorphous semiconductor film is formed with gaseous boron trifluoride (BF$_3$) as a dopant, the film containing boron atoms at a concentration in the range of $1 \times 10^{20} - 2 \times 10^{21}$ atoms/cm$^3$, and the concentration of fluorine atoms in the film being no more than one half of the concentration of boron atoms. A process for producing an amorphous photo-electric transducer is also disclosed, wherein the p-type amorphous semiconductor film is formed by a pulse discharge-assisted chemical vapor deposition (CVD) technique which decomposes a feed gas including gaseous boron trifluoride (BF$_3$) as a dopant.

5 Claims, 2 Drawing Sheets

PROCESS FOR PRODUCING AN AMORPHOUS PHOTOELECTRIC TRANSDUCER

BACKGROUND OF THE INVENTION

1. Field of the Invention

The present invention relates to amorphous photoelectric transducers such as solar cells which use a p-n or p-i-n junction in an amorphous semiconductor to convert energy light, such as sunlight, to electric energy, as well as to a process for producing such transducers.

2. Description of the Related Art

In order to form an amorphous semiconductor having a p-n or p-i-n junction, p-type and n-type layers of amorphous semiconductor material, or p-type, i-type and n-type layers of amorphous semiconductor material, must be superposed, in this order or in the reverse order, on a substrate with an interposed electrode layer. Amorphous silicon (hereafter designated a-Si:H) is the best known of amorphous semiconductors. An amorphous silicon layer is typically formed on a substrate by a plasma assisted chemical vapor deposition (CVD) process in which a $SiH_4$ based feed gas is decomposed within a plasma generated by a high frequency discharge on the order of 13.56 MHz, for example. In order to produce an a-Si:H layer having a desired conduction type, an appropriate dopant is mixed in the feed gas. For producing a p-type a-Si:H layer, diborane ($B_2H_6$) or boron trifluoride ($BF_3$) is used as the dopant. When the p-type layer is to be used as a window for admitting incident light, its optical band gap desirably is as large as possible to insure minimum light absorption by that layer.

However, when the impurity level of the p-type a-Si:H layer is controlled by plasma-assisted CVD with the feed gas containing a diborane dopant gas subjected to discharge at a high frequency such as 13.56 MHz, the hydrogen content of the p-type film decreases as the boron level increases and the resulting narrow optical band gap makes the p-type film unsuitable for use as the window of a photoelectric transducer. If $BF_3$ is used as a dopant, the decrease in the hydrogen content of the film is smaller than when diborane is used, but, the strong binding of boron and fluorine atoms yields residual B-F bonds in the film that lower the degree of activation of boron atoms.

SUMMARY OF THE INVENTION

The present invention is addressed to a solution of the aforementioned problems and has as an object, the provision of an amorphous photoelectric transducer having a p-type amorphous semiconductor film that is improved, not only in the optical band gap, but also in the degree of activation of doped boron atoms.

Another object of the present invention is to provide a process for producing the improved amorphous photoelectric transducer.

To achieve the objects and in accordance with the purpose of the invention, as embodied and broadly described herein, the invention comprises an amorphous photoelectric transducer of the type that converts light energy to electric energy using a p-n or p-i-n junction in an amorphous semiconductor having a p-type film on the light entrance side, the transducer being characterized in that the p-type amorphous semiconductor film is formed with gaseous boron trifluoride ($BF_3$) used as a dopant, the film containing boron atoms at a concentration in the range of $1 \times 10^{20} - 2 \times 10^{21}$ atoms/$cm^3$, and the concentration of fluorine atoms in the film being no more than a half of the concentration of boron atoms.

Further, the invention comprises a process for producing an amorphous photoelectric transducer of the type that converts light energy to electric energy using a p-n or p-i-n junction in an amorphous semiconductor having a p-type film on the entrance side. In the process, the p-type amorphous semiconductor film is formed by a chemical vapor deposition (CVD) technique which decomposes a feed gas by discharging, the feed gas including gaseous boron trifluoride ($BF_3$) as a dopant, and the CVD technique being based on pulsed discharging.

By adjusting the boron concentration of the p-type film to be at least $1 \times 10^{20}$ atoms/$cm^3$, a dark conductivity optimum for the window layer of the photoelectric transducer can be obtained. By adjusting the boron concentration of the p-type film to be no more than $2 \times 10^{21}$ atoms/$cm^3$, a decrease in the optical band gap can be prevented. In addition, by reducing the concentration of fluorine atoms in the p-type film to be no more than one-half of the concentration of boron atoms, the degree of activation of boron atoms can be markedly improved. In the process of the present invention, by adopting a CVD technique based on pulsed discharging, the efficiency of decomposition of $BF_3$ used as the dopant gas is enhanced whereas the amount of B-F bonds in the film is reduced and. As a result, the concentration of fluorine atoms in the film can be reduced to no more than one half of the concentration of boron atoms.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

BRIEF DESCRIPTION OF THE DRAWINGS

The accompanying drawings, which are incorporated in and constitute a part of this specification, illustrate an embodiment of the invention and together with the description, serve to explain the principles of the invention.

DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

Figure 4:
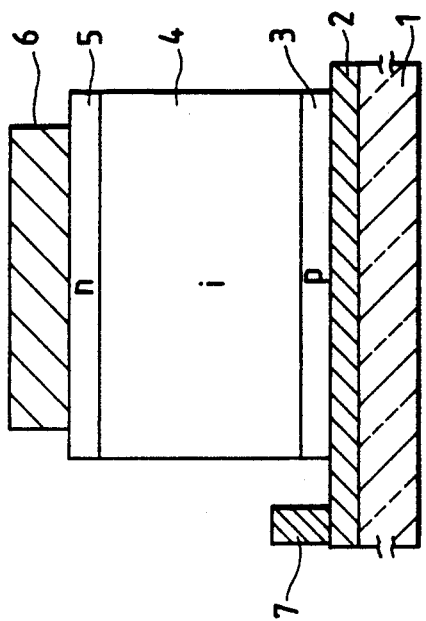
FIG. 4 is a cross section of a photoelectric transducer according to an embodiment of the present invention.

In FIG. 4, a cross section of a photoelectric transducer in accordance with an embodiment of the present invention is shown. A glass substrate 1 is overlaid with a transparent conductive film 2 typically formed of tin oxide by a suitable method such as thermal CVD. Then, using a SiH$_4$—CH$_4$ feed gas containing BF$_3$ dopant gas, a p-type a-SiC:H film 3 is formed on the transparent conductive film 2. In accordance with the present invention, the concentration of boron atoms in the p-type film 3 is controlled to be within the range of $1 \times 10^{20} - 2 \times 10^{21}$ atoms/cm$^3$ and the concentration of fluorine atoms in that film is controlled to be no more than one-half of the concentration of boron atoms. To reduce the concentration of fluorine atoms in the film 3, a PD (pulse discharge) assisted CVD process is typically employed but any other technique may be adopted as long as the fluorine content can be reduced. On the film 3, an undoped (i-type) a-Si:H film 4 is formed by a plasma-assisted CVD process, which in turn is overlaid with a phosphorour-doped n-type a-Si:H film 5. Thereafter, a back metal electrode film 6 is formed on the film 5 by a suitable technique such as evaporation or sputtering. A metal terminal 7 is provided in an area close to the edge of the transparent conductive film 2.

Figure 1:
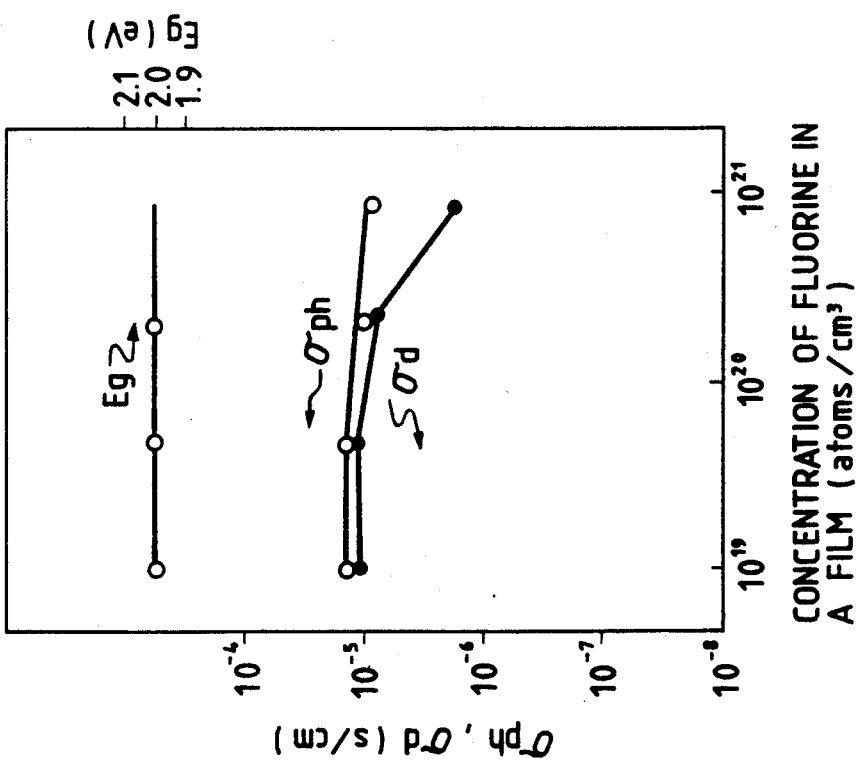
FIG. 1 is a graph showing the relationship between the concentration of fluorine atoms in a p-type a-SiC:H film, formed by PD-CVD using $BF_3$ as a dopant gas, and three characteristics of that film, i.e., photoconductivity, dark conductivity, and optical band gap.

The relationship between the concentrations of boron and fluorine in the p-type a-SiC:H film 3 was determined from the results of the following two film doping experiments. In the first experiment, an a-SiC:H film adjusted to have an optical band gap energy (Eg) of 2 eV was doped with $4 \times 10^{20}$ boron (B) atoms. per cubic centimeter and the film was grown at varying concentrations of fluorine (F) atoms. The characteristic curves for measured values of photoconductivity ($\sigma_{ph}$) and dark conductivity ($\sigma_d$) are shown in FIG. 1, which illustrates that when the fluorine content dropped below $2 \times 10^{20}$ atoms/cm$^3$, which was one half the boron content, the value of the dark conductivity suddenly became closer to the value of the photoconductivity. Obviously, the activation of boron atoms is enhanced and the dark conductivity is markedly improved by adjusting the fluorine concentration to be no more than a half, preferably no more than a tenth, of the boron concentration.

Figure 2:
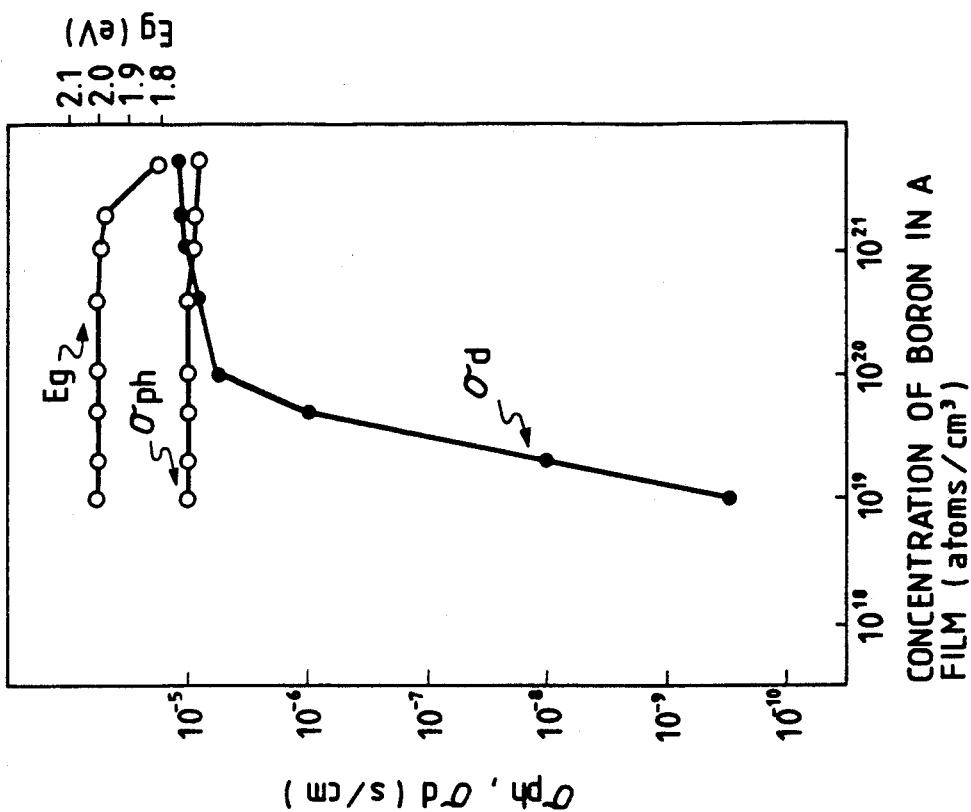
FIG. 2 is a graph showing the relationship between the concentration of boron atoms in a p-type a-SiC:H film formed by the PD-CVD method and three characteristics of that film: i.e., photoconductivity, dark conductivity, and optical band gap.
Figure 3:
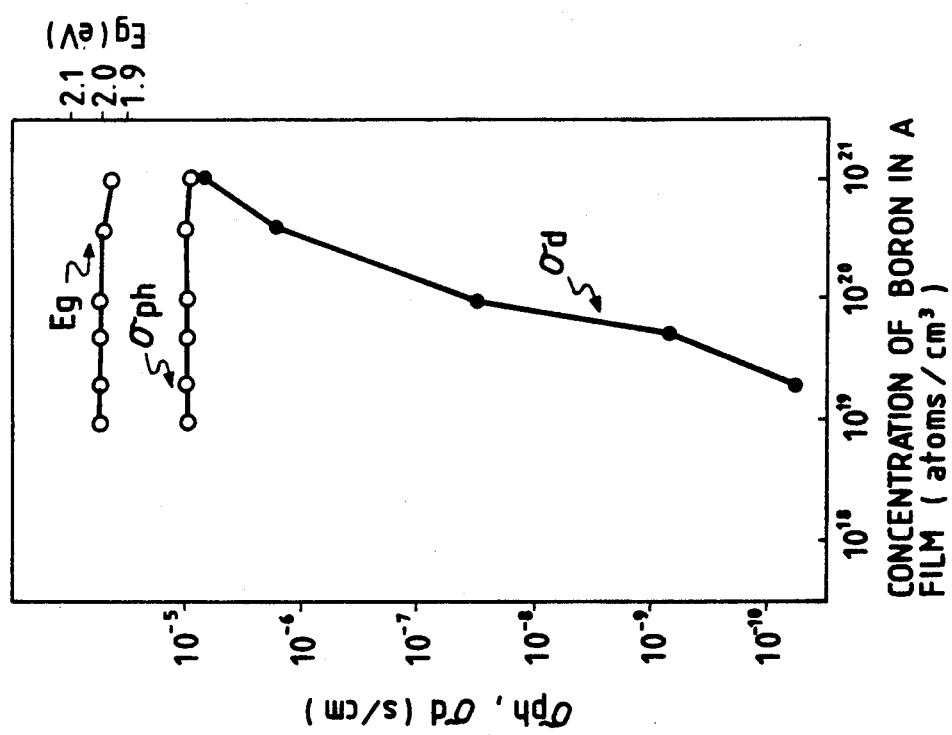
FIG. 3 is a graph showing the relationship between the concentration of boron atoms in a p-type a-SiC:H film formed by a conventional plasma-assisted CVD process and three characteristics of that film: i.e., photoconductivity, dark conductivity, and optical band gap.

In the second experiment using the PD-CVD method, the boron content of an a-SiC:H film was varied with the fluorine content not exceeding one half the boron content and the characteristic curves for measured values of the optical band gap energy (Eg), photoconductivity ($\sigma_{ph}$), and dark conductivity ($\sigma_d$) are shown in FIG. 2. As a comparison, a p-type a-SiC:H film was formed by a conventional rf plasma-assisted CVD process and the changes in the film characteristics for the case where the fluorine content was about twice the boron content are shown in FIG. 3. By comparing the values of $\sigma_d$ in FIGS. 3 and 2, one can see that the activation of boron atoms was enhanced by adjusting the fluorine concentration to be no more than a half of the boron concentration. FIG. 2 also shows that a dark conductivity optimum for the window layer of a photoelectric transducer can be achieved at boron concentrations of $1 \times 10^{20}$ atoms/cm$^3$ and above and that the occurrence of a drop in the optical band gap can be prevented if the boron concentration is not higher than $2 \times 10^{21}$ atoms/cm$^3$ Obviously, it is critical for the purposes of the present invention to control the boron concentration to within the range of $1 \times 10^{20} - 2 \times 10^{21}$ atoms/cm$^3$.

Table 1 shows the characteristics of the photoelectric transducer fabricated in the embodiment of the present invention using a p-type amorphous semiconductor film formed by pulsed discharge assisted CVD with BF used as a dopant source, as well as the characteristics of two comparative photoelectric transducers fabricated using p-type amorphous semiconductor films formed by the prior art process. In Comparison 1, a p-type film was prepared by a conventional plasma-assisted CVD technique using BF$_3$ as a dopant source and in Comparison 2, a p-type film was prepared by a conventional plasma-assisted CVD technique using B$_2$H$_6$ as a dopant source.

TABLE 1

|  | Open-circuit voltage $V_{oc}$ (V) | Short-circuit current $J_{sc}$ (mA/cm$^2$) | Fill factor FF | Conversion efficiency $\eta$ (%) |
| --- | --- | --- | --- | --- |
| Invention | 0.90 | 19.0 | 0.73 | 12.4 |
| Comparison 1 | 0.88 | 18.0 | 0.73 | 11.5 |
| Comparison 2 | 0.88 | 17.3 | 0.73 | 11.1 |

As one can see from Table 1, the photoelectric transducer of the present invention has better characteristics than Comparisons 1 and 2.

In accordance with the present invention, when fabricating an amorphous photoelectric transducer that is composed of an amorphous semiconductor containing amorphous silicon or amorphous silicon carbide and which has at least one p-n or p-i-n junction, the impurity level of the p-type amorphous layer is controlled using BF$_3$ as a dopant gas which is known to be capable of reducing the reduction of the hydrogen content of the film as the boron concentration is increased and, as a result, the concentration of boron atoms in the film is adjusted to within the range of $1 \times 10^{20} - 2 \times 10^{21}$ atoms/cm$^3$. In addition, a pulsed discharge assisted CVD process or some other appropriate technique is used to control the concentration of fluorine atoms in the film to be no more than one-half of the concentration of boron atoms in the film, whereby the dark conductivity of the film is increased without causing a drop in the optical band gap so as to markedly improve the conversion characteristics of the amorphous photoelectric transducer.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. In a process for producing an amorphous photoelectric transducer which converts light energy to electric energy using a p-n or p-i-n junction in an amorphous semiconductor having a p-type film on the light entrance side, the improvement wherein the p-type amorphous semiconductor film is formed by a pulse discharge-assisted chemical vapor deposition technique which decomposes a feed gas by discharging, said feed gas containing gaseous boron trifluoride dopant.

2. A process according to claim 1 wherein said feed gas contains monosilane and methane gases as main components.

3. A process according to claim 1 wherein said p-type amorphous semiconductor film is comprised of amorphous silicon carbide.

4. A process according to claim 1 wherein said p-type amorphous semiconductor film contains a concentration of boron atoms in the range of $1 \times 10^{20} - 2 \times 10^{21}$ atoms/cm$^3$, and a concentration of fluorine atoms not more than ½ of said concentration of boron atoms.

5. A process according to claim 4 wherein said concentration of fluorine atoms is not more than 1/10 of said concentration of boron atoms.

* * * * *